(12) United States Patent
Huang et al.

(10) Patent No.: US 11,387,843 B1
(45) Date of Patent: Jul. 12, 2022

(54) METHOD AND APPARATUS FOR ENCODING AND DECODING OF FLOATING-POINT NUMBER

(71) Applicant: NEUCHIPS CORPORATION, Hsinchu (TW)

(72) Inventors: Juinn Dar Huang, Hsinchu County (TW); Cheng Wei Huang, Hsinchu County (TW); Tim Wei Chen, Taipei (TW); Chiung-Liang Lin, Taichung (TW)

(73) Assignee: NEUCHIPS CORPORATION, Hsinchu (TW)

( * ) Notice: Subject to any disclaimer, the term of this patent is extended or adjusted under 35 U.S.C. 154(b) by 0 days.

(21) Appl. No.: 17/238,226

(22) Filed: Apr. 23, 2021

(30) Foreign Application Priority Data

Mar. 23, 2021 (TW) .................. 110110407

(51) Int. Cl.
  *H03M 7/00* (2006.01)
  *H03M 7/24* (2006.01)
  *G06F 7/485* (2006.01)
  *H03M 7/30* (2006.01)

(52) U.S. Cl.
  CPC .............. *H03M 7/24* (2013.01); *G06F 7/485* (2013.01); *H03M 7/6005* (2013.01); *H03M 7/6011* (2013.01)

(58) Field of Classification Search
  CPC .... H03M 7/24; H03M 7/6005; H03M 7/6011; G06F 7/485
  USPC ...................................................... 341/50, 51
  See application file for complete search history.

(56) References Cited

U.S. PATENT DOCUMENTS

| | | | |
|---|---|---|---|
| 9,104,473 | B2 | 8/2015 | Wegener |
| 9,660,666 | B1 | 5/2017 | Ciarlini et al. |
| 10,200,060 | B1 | 2/2019 | Ciarlini et al. |
| 2006/0181436 | A1 | 8/2006 | Moriya et al. |
| 2006/0284747 | A1* | 12/2006 | Moriya ............... H03M 7/24 341/51 |

(Continued)

FOREIGN PATENT DOCUMENTS

| | | |
|---|---|---|
| CN | 101019325 | 8/2007 |
| TW | 201322118 | 6/2013 |

(Continued)

OTHER PUBLICATIONS

"Office Action of Taiwan Counterpart Application", dated Mar. 22, 2022, p. 1-p. 7.

*Primary Examiner* — Jean B Jeanglaude
(74) *Attorney, Agent, or Firm* — JCIPRNET

(57) ABSTRACT

A method and apparatus for encoding and decoding of floating-point number is provided. The method for encoding is used to convert at least one original floating-point number to at least one encoded floating-point number. The method for encoding includes: determining a number of exponent bits of the at least one encoded floating-point number and calculating an exponent bias according to at least one original exponent value of the at least one original floating-point number; and converting an original exponent value of a current original floating-point number of the at least one original floating-point number to an encoded exponent value of a current encoded floating-point number of the at least one encoded floating-point number according to the exponent bias.

34 Claims, 2 Drawing Sheets

(56) References Cited

U.S. PATENT DOCUMENTS

| | | | | |
|---|---|---|---|---|
| 2007/0258641 | A1* | 11/2007 | Srinivasan | H04N 1/407 |
| | | | | 382/166 |
| 2012/0259904 | A1* | 10/2012 | Bishop | H03M 7/02 |
| | | | | 708/503 |
| 2013/0004078 | A1* | 1/2013 | Miyazaki | G06Q 10/10 |
| | | | | 726/1 |
| 2013/0060827 | A1 | 3/2013 | Wegener | |
| 2014/0101215 | A1* | 4/2014 | Ayoub | H03M 7/12 |
| | | | | 708/204 |
| 2017/0194986 | A1 | 7/2017 | Hong et al. | |
| 2020/0225948 | A1 | 7/2020 | Sim et al. | |

FOREIGN PATENT DOCUMENTS

| | | |
|---|---|---|
| TW | I506539 | 11/2015 |
| TW | I524265 | 3/2016 |

* cited by examiner

METHOD AND APPARATUS FOR ENCODING AND DECODING OF FLOATING-POINT NUMBER

CROSS-REFERENCE TO RELATED APPLICATION

This application claims the priority benefit of Taiwan application serial no. 110110407, filed on Mar. 23, 2021. The entirety of the above-mentioned patent application is hereby incorporated by reference herein and made a part of this specification.

BACKGROUND

1. Technical Field

The disclosure relates to a method and an apparatus for encoding and decoding of floating-point number.

2. Description of Related Art

Floating-point (FP) number is an approximate value representation of real numbers. In the IEEE standard for binary floating-point arithmetic (such as IEEE 754), floating-point numbers are specified to include three fields: "sign", "exponent" and "fraction". "Sign" represents positive/negative sign of a floating-point number, "exponent" represents the power of a floating-point number (based on two), and "fraction" represents the decimal of a floating-point number (the integer part of a floating-point number in the normalized form is preset to 1, and the integer part of a floating-point number in the non-normalized form is preset to 0). The IEEE standard for binary floating-point arithmetic adopts a fixed "exponent bias". The exponent bias is fixed at "127". The exponent value of the floating-point number plus 127 (fixed exponent bias) is the exponent value of the real number. For example, taking the 32-bit single-precision floating-point number specified by IEEE 754 as an example, the bit number for its sign, exponent, and fraction are 1, 8, and 23 bits, respectively. Assuming that the sign value of the floating-point number is s, the exponent value of the floating-point number is exp, and the fraction value of the floating-point number is f, the real number is $(-1)^{s}*2^{(exp-127)}*1.f$. The exponent range of the floating-point number specified by IEEE 754 is 0-255, and the exponent range of the real number represented by the floating-point number is −126-127.

However, in practical applications, the exponent values of a group of real numbers (floating-point numbers) may be concentrated in a narrow range. For example, if the exponent of a group of real numbers is between −10 and −3, the exponent of the corresponding floating-point number is between 117 and 124. Obviously, the group of real numbers only uses a very small part of the exponent range −126-127 that may be represented by the floating-point numbers, resulting in a waste of the storage space of the floating-point numbers.

SUMMARY

The disclosure provides a method and an apparatus for encoding and decoding of floating-point number, which is able to encode/decode floating-point numbers so as to effectively reduce the data volume of the floating-point numbers.

In an embodiment of the disclosure, the method for encoding of floating-point number converts at least one original floating-point number to at least one encoded floating-point number. The method for encoding includes: determining a number of exponent bits of the at least one encoded floating-point number and calculating an exponent bias according to at least one original exponent value of the at least one original floating-point number; and converting an original exponent value of a current original floating-point number of the at least one original floating-point number to an encoded exponent value of a current encoded floating-point number of the at least one encoded floating-point number according to the exponent bias.

In an embodiment of the disclosure, the apparatus for encoding of floating-point number includes an arithmetic circuit, a storage unit, and a conversion circuit. The arithmetic circuit generates at least one original floating-point number. The conversion circuit is coupled to the arithmetic circuit so as to receive the at least one original floating-point number. The conversion circuit determines a number of exponent bits of the at least one encoded floating-point number and calculates an exponent bias according to at least one original exponent value of the at least one original floating-point number. The conversion circuit converts an original exponent value of a current original floating-point number of the at least one original floating-point number to an encoded exponent value of a current encoded floating-point number of the at least one encoded floating-point number according to the exponent bias. The conversion circuit stores the at least one encoded floating-point number in the storage unit.

In an embodiment of the disclosure, the method for decoding of floating-point number converts at least one encoded floating-point number to at least one decoded floating-point number. The method for decoding includes: receiving an exponent bias corresponding to the at least one encoded floating-point number; converting an encoded exponent value of a current encoded floating-point number of the at least one encoded floating-point number to a decoded exponent value of a current decoded floating-point number of the at least one decoded floating-point number according to the exponent bias and a standard bias.

In an embodiment of the disclosure, the apparatus for decoding of floating-point number includes a storage unit, an arithmetic circuit, and a conversion circuit. The storage unit stores at least one encoded floating-point number and an exponent bias corresponding to the at least one encoded floating-point number. The conversion circuit is coupled to the storage unit so as to receive the at least one encoded floating-point number and the exponent bias. The conversion circuit converts an encoded exponent value of a current encoded floating-point number of the at least one encoded floating-point number to a decoded exponent value of a current decoded floating-point number of at least one decoded floating-point number according to the exponent bias and a standard bias. The conversion circuit provides the at least one decoded floating-point number to the arithmetic circuit.

Based on the above, the embodiments of the disclosure provide a decompression and decompression technology of floating-point number. The method for encoding of floating-point number can dynamically adjust the number of exponent bits and exponent bias according to the original exponent value of the original floating-point number, and convert the original floating-point number to the encoded floating-point number according to the number of exponent bits and exponent bias. The number of exponent bits of the encoded floating-point number is related to the exponent range of the original floating-point number. In this way, the data structure of the floating-point number can be dynamically changed according to the actual exponent range of the original floating-point number so as to effectively compress the data volume of the floating-point number, thereby saving the storage space of the floating-point number. On the other hand, the method for decoding of floating-point number may convert the encoded exponent value of the encoded floating-point number back to the decoded exponent value of the decoded floating-point number according to the standard bias and the exponent bias corresponding to the encoded floating-point number, and may then convert the encoded floating-point number to the decoded floating-point number. In this way, according to actual requirements of application, the data structure of the encoded floating-point number (compressed floating-point number) can be decoded back to the data structure of the standard floating-point number.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
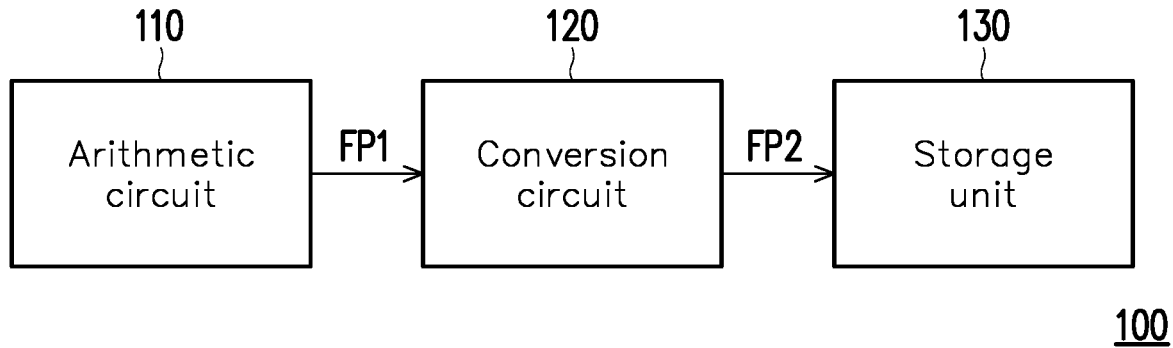
FIG. 1 is a schematic diagram of a circuit block of an apparatus for encoding of floating-point number according to an embodiment of the disclosure.

Reference will now be made in detail to the exemplary embodiments of the disclosure, examples of which are illustrated in the accompanying drawings. Wherever possible, the same reference numbers are used in the drawings and the description to refer to the same or like parts.

The term "coupling (or connection)" used in the full text of the specification of the disclosure (including the claims) may refer to any direct or indirect means of connection. For example, if the text describes that a first apparatus is coupled (or connected) to a second apparatus, it should be interpreted as that the first apparatus may be directly connected to the second apparatus, or the first apparatus may be indirectly connected to the second apparatus through other apparatuses or some kind of connection means. The terms "first" and "second" mentioned in the entire specification of the disclosure (including claims) are used to name the elements, or to distinguish between different embodiments or ranges, and are not used to limit the upper or lower limit of the number of elements, nor are they used to limit the order of the components. In addition, wherever possible, elements/components/steps using the same reference numbers in the drawings and embodiments represent the same or similar elements/components/steps. Elements/components/steps that use the same reference numerals or use the same terms in different embodiments may be cross-referenced for relevant descriptions.

FIG. 1 is a schematic diagram of a circuit block of an apparatus 100 for encoding of floating-point number according to an embodiment of the disclosure. In the embodiment shown in FIG. 1, the apparatus 100 for encoding includes an arithmetic circuit 110, a conversion circuit 120, and a storage unit 130. According to actual design, the arithmetic circuit 110 may perform any application-specific arithmetic, such as Neural Network arithmetic or other arithmetics. The arithmetic result of the arithmetic circuit 110 includes one floating-point number FP1 or multiple original floating-point numbers FP1. The storage unit 130 is configured to store the arithmetic result of the arithmetic circuit 110. In order to save the storage space of the floating-point number, the original floating-point number FP1 needs to be compressed. The conversion circuit 120 is coupled to the arithmetic circuit 110 so as to receive the original floating-point number FP1 generated by the arithmetic circuit 110. The conversion circuit 120 may convert the data structure of the original floating-point number FP1 (i.e. performing a method for encoding or a method for compression) so as to generate an encoded floating-point number (compressed floating-point number) FP2. The storage unit 130 is coupled to the conversion circuit 120 so as to receive and store the encoded floating-point number FP2.

The related functions of the arithmetic circuit 110 and/or the conversion circuit 120 may be implemented as hardware using hardware description languages (such as Verilog HDL or VHDL) or other suitable programming languages. For example, the related functions of the arithmetic circuit 110 and/or the conversion circuit 120 may be implemented in one or more microcontrollers, microprocessors, application-specific integrated circuits (ASICs), digital signal processors (DSPs), field programmable gate arrays (FPGAs) and/or various logic blocks, modules and circuits in other processing units. In terms of software and/or firmware, related functions of the arithmetic circuit 110 and/or conversion circuit 120 may be implemented as programming codes, for example, as general programming languages (such as C, C++ or assembly language) or other suitable programming languages. The programming code may be recorded/stored in a "non-transitory computer readable medium", such as programmable logic circuits and/or storage apparatuses including Read Only Memory (ROM), tape, disc, card, semiconductor memory, programmable logic circuit, and/or storage unit. A central processing unit (CPU), microcontroller, or microprocessor may read and execute the programming code from the non-temporary computer readable medium, so as to achieve related functions. The storage unit 130 may be, for example, any type of random access memory (RAM), read-only memory (ROM), flash memory, hard disk or other similar apparatuses, or a combination of the apparatuses.

Figure 2:
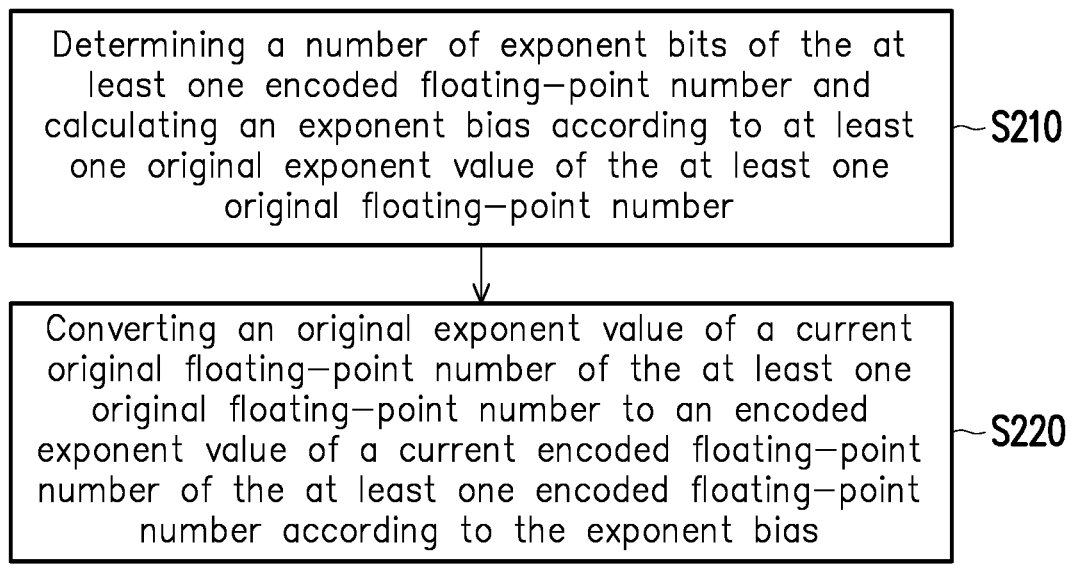
FIG. 2 is a schematic flowchart of a method for encoding of floating-point number according to an embodiment of the disclosure.

FIG. 2 is a schematic flowchart of a method for encoding of floating-point number according to an embodiment of the disclosure. Please refer to FIGS. 1 and 2. In the method for encoding shown in FIG. 2, the original floating-point number FP1 may be converted to the encoded floating-point number FP2. In step S210, the conversion circuit 120 may determine the number of exponent bits of the encoded floating-point number FP2 and calculate the exponent bias according to the original exponent values of the original floating-point number FP1.

For example, in some embodiments, the original floating-point number FP1 includes multiple original floating-point numbers. The conversion circuit 120 may count the original exponent values of the original floating-point number FP1 so as to obtain a value range of the original exponent values.

The conversion circuit 120 may determine the number of exponent bits of the encoded floating-point number FP2 according to the value range. The conversion circuit 120 may select one of the original exponent values as a first representative value. The selection of the first representative value may be determined according to design requirements. For example, in some embodiments, the first representative value may be a largest original exponent value in the original exponent values. According to actual design, in other embodiments, the first representative value may also be the minimum original exponent value, an average value, or any threshold value in the original exponent values. The conversion circuit 120 may select a value corresponding to the first representative value from the value range of the number of exponent bits of the encoded floating-point number FP2 as the second representative value. The conversion circuit 120 may take the first representative value and the second representative value to calculate the exponent bias of the encoded floating-point number FP2. In some embodiments, the second representative value may be the largest value in the value range of the number of exponent bits of the encoded floating-point number FP2. According to actual design, in other embodiments, the second representative value may also be the minimum value, the middle value or any threshold value in the value range of the number of exponent bits of the encoded floating-point number FP2.

Taking the specific numbers shown in Table 1 as an operation example of step S210, s1 shown in Table 1 represents an original sign value of the original floating-point number FP1, exp1 shown in Table 1 represents an original exponent value of the original floating-point number FP1, and frac1 shown in Table 1 represents an original fraction value of the original floating-point number FP1. It is assumed here that the data structure of the original floating-point number FP1 meets the standard specified by IEEE for binary floating-point arithmetic (such as IEEE 754). That is, the original sign value s1 is a 1-bit value, the original exponent value exp1 is an 8-bit value, and the original fraction value frac1 is a 23-bit value.

TABLE 1

A specific example of a group of original floating-point number FP1.

| Original floating-point number FP1 | | | |
|---|---|---|---|
| Actual value | s1 | exp1 | frac1 |
| −0.14340503513813 | 1 | 124 | 1235141 |
| −0.00837268307805061 | 1 | 120 | 601492 |
| 0.148268431425094 | 0 | 124 | 1561518 |
| −0.0950070098042488 | 1 | 123 | 4363017 |
| −0.0804879069328308 | 1 | 123 | 2414296 |
| 0.0647494941949844 | 0 | 123 | 301922 |
| −0.0048374212346971 | 1 | 119 | 1999675 |
| 0.0136836534366011 | 0 | 120 | 6304103 |
| −0.0555856153368949 | 1 | 122 | 6532542 |
| 0.0340273454785347 | 0 | 122 | 745538 |
| 0.00778315449133515 | 0 | 119 | 8325589 |
| −0.00458043720573186 | 1 | 119 | 1447806 |

The conversion circuit 120 may count the original exponent values exp1 of the original floating-point number FP1 shown in Table 1 to obtain the value range of the original exponent values exp1. The conversion circuit 120 may determine the number of exponent bits of the encoded floating-point number FP2 according to the value range of the original exponent values exp1 shown in Table 1. The original exponent values exp1 shown in Table 1 range from 119 to 124, and there are 6 integers in the value range of 119 to 124. Therefore, the number of exponent bits of the encoded floating-point number FP2 may be set as 3 bits, where the value range of the exponent bits of the encoded floating-point number FP2 is 0-7.

The conversion circuit 120 may select one of the original exponent values exp1 shown in Table 1 as the first representative value. For example, the first representative value may be the largest original exponent value "124" in the original exponent values exp1. The conversion circuit 120 may select a value corresponding to the first representative value from the value range of the number of exponent bits (3 bits) of the encoded floating-point number FP2 as the second representative value. For example, the second representative value may be the largest value "7" in the value range "0-7" of the exponent bits of the encoded floating-point number FP2. The conversion circuit 120 may take the first representative value "124" and the second representative value "7" to calculate an exponent bias exp_b2 of the encoded floating-point number FP2. At this time, $exp1 - exp\_b1 = 124 - 127 = 7 - exp\_b2$, where exp_b1 represents the fixed exponent bias "127" adopted by the IEEE standard for binary floating-point arithmetic. Therefore, the exponent bias exp_b2 of the encoded floating-point number FP2 is "10".

In step S220, the conversion circuit 120 may convert the original exponent value of a current original floating-point number in the original floating-point number FP1 to an encoded exponent value of a current encoded floating-point number in the encoded floating-point number FP2 according to the exponent bias of the encoded floating-point number FP2. In addition, according to actual design, the conversion circuit 120 may also take the sign value of the current original floating-point number as the sign value of the current encoded floating-point number, and the conversion circuit 120 may also take the fraction value of the current original floating-point number as the fraction value of the current encoded floating-point number. Then, the conversion circuit 120 may store the current encoded floating-point number of the encoded floating-point number FP2 to the storage unit 130.

Here, the specific example of the original floating-point number FP1 shown in Table 1 is continued to be used to illustrate the operation of step S220, and the operation result of step S220 is presented in Table 2 below. For the examples shown in Table 2, refer to the related descriptions in Table 1. An exp2 shown in Table 2 represents the encoded exponent value of the encoded floating-point number FP2, and a frac2 shown in Table 2 represents the fraction value of the encoded floating-point number FP2. It is assumed here that the data structure of the original floating-point number FP1 is a 32-bit value that meets the standard specified by IEEE for binary floating-point arithmetic (such as IEEE 754), and the data structure of the encoded floating-point number FP2 is an 8-bit value. The sign value of the encoded floating-point number FP2 is a 1-bit value, and the encoded exponent value exp2 of the encoded floating-point number FP2 is a 3-bit value (the bit number of the encoded exponent value exp2 is dynamically determined in step S210). Subtracting the sign field (1 bit) and the exponent field (3 bits) from the total bit number "8 bits" of the encoded floating-point number FP2, the remaining bit number is "4 bits". The remaining bits may be used to record the fraction value frac2 of the encoded floating-point number FP2. Therefore, the fraction value frac2 of the encoded floating-point number FP2 shown in Table 2 is a 4-bit value.

TABLE 2

Conversion results of the encoded floating-point number FP2

| Original float-point number FP1 | | | | Encoded floating-point number FP2 | | |
|---|---|---|---|---|---|---|
| Actual value | s1 | exp1 | frac1 | exp2 | frac2 | Actual value |
| −0.14340503513813 | 1 | 124 | 1235141 | 7 | 2 | −0.140625 |
| −0.00837268307805061 | 1 | 120 | 601492 | 3 | 1 | −0.00830078125 |
| 0.148268431425094 | 0 | 124 | 1561518 | 7 | 2 | 0.140625 |
| −0.0950070098042488 | 1 | 123 | 4363017 | 6 | 8 | −0.09375 |
| −0.0804879069328308 | 1 | 123 | 2414296 | 6 | 4 | −0.078125 |
| 0.0647494941949844 | 0 | 123 | 301922 | 6 | 0 | 0.0625 |
| −0.0048374212346971 | 1 | 119 | 1999675 | 2 | 3 | −0.00463867188 |
| 0.0136836534366011 | 0 | 120 | 6304103 | 3 | 12 | 0.013671875 |
| −0.0555856153368949 | 1 | 122 | 6532542 | 5 | 12 | −0.0546875 |
| 0.0340273454785347 | 0 | 122 | 745538 | 5 | 1 | 0.033203125 |
| 0.00778315449133515 | 0 | 119 | 8325589 | 2 | 15 | 0.00756835938 |
| −0.00458043720573186 | 1 | 119 | 1447806 | 2 | 2 | −0.00439453125 |

In the embodiments shown in Table 1 and Table 2, in step S210, it may be calculated that the exponent bias exp_b2 of the encoded floating-point number FP2 is "10". The conversion circuit 120 may convert the original exponent value exp1 of a current floating-point number of the original floating-point number FP1 shown in Table 2 to the encoded exponent value exp2 of a current encoded float-point number of the original floating-point number FP2 shown in Table 2 according to the exponent bias exp_b2 of the encoded floating-point number FP2. For example, the conversion circuit 120 may calculate that exp2=exp1−exp_b1+exp_b2 to obtain the encoded exponent value exp2 of the current encoded floating-point number. Taking the first floating-point number shown in Table 2 as a calculation example, exp2=exp1−exp_b1+exp_b2=124−127+10=7. Taking the second floating-point number shown in Table 2 as a calculation example, exp2=120−127+10=3. Other floating-point numbers shown in Table 2 may be deduced likewise. For the exponent, the conversion circuit 120 may convert the 8-bit original exponent value exp1 to the 3-bit encoded exponent value exp2. Therefore, the conversion circuit 120 can effectively reduce the bit number of the encoded floating-point number FP2.

In some embodiments, the bit number of the fraction value frac2 of the encoded floating-point number FP2 may be the same as the bit number of the fraction value frac1 of the original floating-point number FP1. In such embodiments, the conversion circuit 120 may take the sign value s1 of the current original floating-point number FP1 as the sign value of the current encoded floating-point number FP2, and the conversion circuit 120 may also take the fraction value frac1 of the current original floating-point number FP1 as the fraction value frac2 of the current encoded floating-point number FP2. Then, the conversion circuit 120 may store the current encoded floating-point number of the encoded floating-point number FP2 to the storage unit 130. In such embodiments, the conversion circuit 120 can achieve "lossless compression" and effectively reduce the bit number of the encoded floating-point number FP2.

According to actual design, in other embodiments, the conversion circuit 120 can further reduce the bit number of the encoded floating-point number FP2. For example, the sign value field of the encoded floating-point number FP2 in the storage unit 130 may be omitted according to actual design. For example, the conversion circuit 120 may include a sign value register (not shown, such as a single-bit register). If the conversion circuit 120 determines that the sign value s1 of each of the original floating-point numbers FP1 is a certain common sign value (for example, both are 1 or 0), the conversion circuit 120 may store the common sign value in the sign value register, and drop the sign value s1 of each of the original floating-point numbers FP1 during converting the original floating-point number FP1 to the encoded floating-point number FP2. That is, in some embodiments, the sign value s1 of each original floating-point numbers FP1 may not need to be stored in the storage unit 130 (the encoded floating-point number FP2 in the storage unit 130 does not have a sign value field). In other embodiments, if it is known that the original floating-point number FP1 is fixed to a positive value or a negative value (the sign value of each of the original floating-point numbers FP1 is fixed to a certain common sign value), the sign value register may be further omitted according to actual design.

Further, in other embodiments, the conversion circuit 120 can also effectively reduce the bit number of the fraction value frac2 of the encoded floating-point number FP2. For example, in the embodiment shown in Table 2, the bit number of the fraction value frac2 of the encoded floating-point number FP2 is reduced from 23 bits to 4 bits. That is, the remaining bit number of the total bit number "8 bits" of the encoded floating point number FP2 after subtracting the sign field (1 bit) and the exponent field (3 bits) is taken as the bit number of the fraction value frac2. When the bit number of the fraction value frac1 is greater than the bit number of the fraction value frac2, a remaining part of the fraction value is dropped or rounded. For example, taking the first floating-point number shown in Table 2 as a calculation example, the binary value of the fraction value frac1 "1235141" is "001 0010 1101 1000 1100 0101", then the conversion circuit 120 may take the high-bit (MSB) 4-bit value "001 0" (decimal value "2") of the fraction value frac1 as the fraction value frac2, and drop or round off the remaining part of the fraction value frac1. Taking the second floating-point number shown in Table 2 as a calculation example, the binary value of the fraction value frac1 "601492" is "000 1001 0010 1101 1001 0100", then the conversion circuit 120 may take the high-bit (MSB) 4-bit value "000 1" (decimal value "1") of the fraction value frac1 as the fraction value frac2, and drop or round off the remaining part of the fraction value frac1. Other floating-point numbers shown in Table 2 may be deduced likewise. In such embodiments, the conversion circuit 120 can achieve "lossy compression" and effectively reduce the bit number of the encoded floating-point number FP2. In some application scenarios, for example, in the application scenario of neural network arithmetic, the error of the low bit (LSB) of the fraction value frac2 is acceptable.

In summary, the present embodiment provides a compression technology (method for encoding) of floating-point number. The method for encoding of floating-point number may dynamically adjust the number of exponent bits and exponent bias exp_b2 according to the original exponent value exp1 of the original floating-point number FP1. The conversion circuit 120 may convert the original floating-point number FP1 to the encoded floating-point number FP2 according to the number of exponent bits and the exponent bias exp_b2. The number of exponent bits of the encoded floating-point number FP2 is related to the exponent range of the original floating-point number FP1. In this way, the data structure of the floating-point number FP2 can be dynamically changed according to the actual exponent range of the original floating-point number FP1 so as to effectively compress the data volume of the floating-point number FP2, thereby saving the storage space of the floating-point number.

Figure 3:
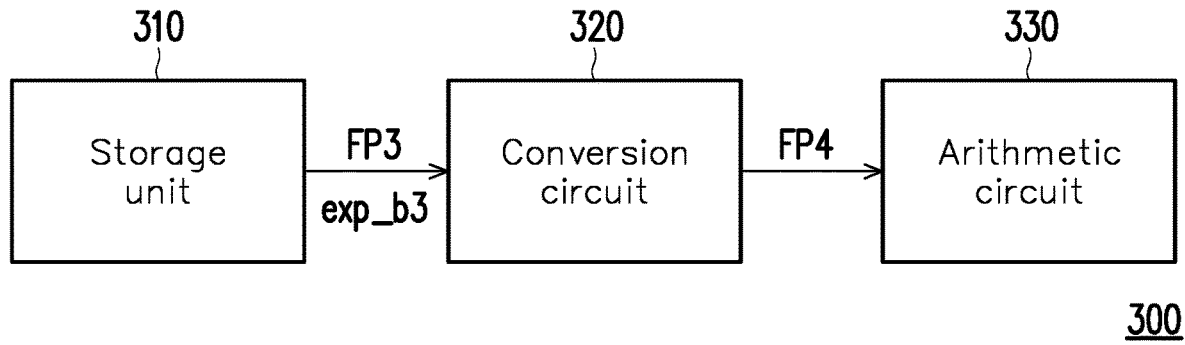
FIG. 3 is a schematic diagram of a circuit block of an apparatus for decoding of floating-point number according to an embodiment of the disclosure.

FIG. 3 is a schematic diagram of a circuit block of an apparatus 300 for decoding of floating-point number according to an embodiment of the disclosure. In the embodiment shown in FIG. 3, the apparatus 300 for decoding includes a storage unit 310, a conversion circuit 320, and an arithmetic circuit 330. The storage unit 310 may store at least one encoded floating-point number FP3 and the exponent bias exp_b3 corresponding to an encoded floating-point number FP3. For the encoded floating-point number FP3 and the exponent bias exp_b3 shown in FIG. 3, reference can be made to related descriptions of the encoded floating-point number FP2 and the exponent bias exp_b2 described in the embodiment shown in FIG. 1 and FIG. 2, and will not be repeated here. According to actual design, in some embodiments, for the storage unit 310 and the arithmetic circuit 330 shown in FIG. 3, referred can be made to related description of the storage unit 130 and the arithmetic circuit 110 shown in FIG. 1.

Figure 4:
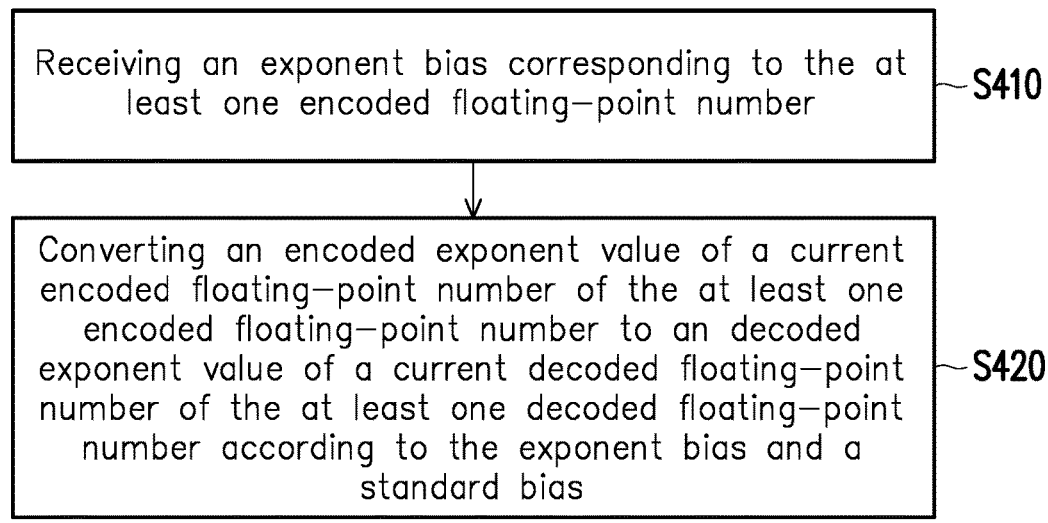
FIG. 4 is a schematic flowchart of a method for decoding of floating-point number according to an embodiment of the disclosure.

FIG. 4 is a schematic flowchart of a method for decoding of floating-point number according to an embodiment of the disclosure. Please refer to FIGS. 3 and 4. In the method for decoding shown in FIG. 4, the encoded floating-point number FP3 may be converted to a decoded floating-point number FP4. In step S410, the conversion circuit 320 is coupled to the storage unit 310 so as to receive the encoded floating-point number FP3 and the exponent bias exp_b3. In step S420, the conversion circuit 320 may convert an encoded exponent value exp3 of the current encoded floating-point number of the encoded floating-point number FP3 to a decoded exponent value exp4 of the current decoded floating-point number of the decoded floating-point number FP4 according to the exponent bias exp_b3 and the standard bias exp_b4. Further, according to actual design, the conversion circuit 320 may also take the sign value of the current encoded floating-point number FP3 as the sign value of the current decoded floating-point number FP4, and the conversion circuit 320 may also take the fraction value of the current encoded floating-point number FP3 as the fraction value of the current decoded floating-point number FP4. Then, the conversion circuit 320 may provide the current encoded floating-point number of the decoded floating-point number FP4 to the arithmetic circuit 330. According to actual design, the arithmetic circuit 330 may use the decoded floating-point number FP4 to perform any application-specific arithmetic, such as neural network arithmetic or other arithmetics.

According to actual design, the data structure of the decoded floating-point number FP4 may be a data structure of floating-point number that complies with the IEEE standard for binary floating-point arithmetic (such as IEEE 754) or other data structures. For example, the sign value of the decoded floating-point number FP4 is a 1-bit value, the decoded exponent value exp4 of the decoded floating-point number FP4 is an 8-bit value, and the fraction value frac4 of the decoded floating-point number FP4 is a 23-bit value. When the decoded floating-point number FP4 is a floating-point number that complies with to the IEEE 754 specification, the standard bias exp_b4 may be a fixed exponent bias "127" specified by the IEEE 754.

In some embodiments, the conversion circuit 320 may calculate the difference between the exponent bias exp_b3 and the standard bias exp_b4 in step S420. According to actual design, in other embodiments, the apparatus 300 for decoding may include a bias register (not shown) to store a preset difference. The difference may be a fixed value or a previously calculated value. For example, the difference between the exponent bias exp_b3 and the standard bias exp_b4 is pre-calculated off-line, and then the difference is stored in the bias register for use in step S420. In such embodiments, according to actual design, the dynamic calculation of the difference between the exponent bias exp_b3 and the standard bias exp_b4 may be omitted in step S420. The conversion circuit 320 may take the difference to convert the encoded exponent value exp3 of the current encoded floating-point number FP3 to the decoded exponent value exp4 of the current decoded floating-point number FP4.

For example, in one embodiment, the conversion circuit 320 may subtract the exponent bias exp_b3 from the standard bias exp_b4 so as to generate the difference, and the conversion circuit 320 may add the difference to the encoded exponent value exp3 of the current encoded floating-point number FP3 so as to generate the decoded exponent value exp4 of the current decoded floating-point number FP4. Assuming that the standard bias exp_b4 is "127", the exponent bias exp_b3 is "10", and the encoded exponent value exp3 of the current encoded floating-point number FP3 is "7", the decoded exponent value exp4 of the current decoded floating-point number FP4 is exp3+(exp_b4−exp_b3)=7+(127−10)=124. Assuming that the encoded exponent value exp3 of the current encoded floating-point number FP3 is "3", the decoded exponent value exp4 of the current decoded floating-point number FP4 is 3+(127−10) =120.

In another embodiment, the conversion circuit 320 may subtract the standard bias exp_b4 from the exponent bias exp_b3 so as to generate the difference, and the conversion circuit 320 may subtract the difference from the encoded exponent value exp3 of the current encoded floating-point number FP3 so as to generate the decoded exponent value exp4 of the current decoded floating-point number FP4. Assuming that the standard bias exp_b4 is "127", the exponent bias exp_b3 is "10", and the encoded exponent value exp3 of the current encoded floating-point number FP3 is "7", the decoded exponent value exp4 of the current decoded floating-point number FP4 is exp3−(exp_b4−exp_b3)=7−(10−127)=124. Assuming that the encoded exponent value exp3 of the current encoded floating-point number FP3 is "3", the decoded exponent value exp4 of the current decoded floating-point number FP4 is 3−(10−127) =120.

In some embodiments, the bit number of a fraction value frac3 of the encoded floating-point number FP3 may be the same as the bit number of the fraction value frac4 of the decoded floating-point number FP4. In such embodiments, the conversion circuit 320 may take the sign value of the current encoded floating-point number FP3 as the sign value of the current decoded floating-point number FP4, and the conversion circuit 320 may also take the fraction value frac3 of the current encoded floating-point number FP3 as the fraction value frac4 of the current decoded floating-point number FP4. Then, the conversion circuit 320 may provide the current decoded floating-point number of the decoded floating-point number FP4 to the arithmetic circuit 330.

Moreover, in some other embodiments, the bit number of the fraction value frac4 of the decoded floating-point number FP4 may be greater than the bit number of the fraction value frac3 of the encoded floating-point number FP3. When the bit number of the fraction value frac4 (fraction field) of the current decoded floating-point number FP4 is greater than the bit number of the fraction value frac3 of the current encoded floating-point number FP3, after filling the fraction value frac3 of the current encoded floating-point number FP3 into the fraction field of the current decoded floating-point number FP4, the conversion circuit 320 may fill in 0 into the remaining part of the fraction field of the current decoded floating-point number FP4.

For example, assuming that the bit number of the fraction value frac4 of the decoded floating-point number FP4 is 23 bits, and the bit number of the fraction value frac3 of the encoded floating-point number FP3 is 4 bits, the conversion circuit 320 may fill in the fraction value frac3 "001 0" of the encoded floating-point number FP3 in the fraction field of the current decoded floating-point number FP4 as a high-bit (MSB) 4-bit value of the fraction value frac4, and the conversion circuit 320 may fill in 0 into the remaining part of the fraction field of the current decoded floating-point number FP4. Therefore, the fraction value frac4 (fraction field) of the current decoded floating-point number FP4 is "001 0000 0000 0000 0000 0000".

In summary, the present embodiment provides a decompression technology (method for decoding) of floating-point number. According to the standard bias exp_b4 and the exponent bias exp_b3 corresponding to the encoded floating-point number FP3, the method for decoding of floating-point number may convert the encoded exponent value exp3 of the encoded floating-point number FP3 back to the decoded exponent value exp4 of the decoded floating-point number FP4. Therefore, according to actual requirements of application, the conversion circuit 320 can convert (decompress) the data structure of the encoded floating-point number FP3 to a standard data structure of floating-point number.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A method for encoding of floating-point number, converting at least one original floating-point number to at least one encoded floating-point number, wherein the method for encoding comprises:
   determining a number of exponent bits of the at least one encoded floating-point number and calculating an exponent bias according to at least one original exponent value of the at least one original floating-point number; and
   converting an original exponent value of a current original floating-point number of the at least one original floating-point number to an encoded exponent value of a current encoded floating-point number of the at least one encoded floating-point number according to the exponent bias.

2. The method for encoding as described in claim 1, further comprising:
   taking a sign value of the current original floating-point number as a sign value of the current encoded floating-point number.

3. The method for encoding as described in claim 1, wherein the at least one original floating-point number comprises a plurality of original floating-point numbers, and the method for encoding further comprises:
   dropping the sign value of each of the original floating-point numbers during converting the original floating-point numbers to the at least one encoded floating-point number, when a sign value of each of the original floating-point numbers is a common sign value.

4. The method for encoding as described in claim 3, further comprising:
   storing the common sign value in a sign value register.

5. The method for encoding as described in claim 1, further comprising:
   taking a fraction value of the current original floating-point number as a fraction value of the current encoded floating-point number.

6. The method for encoding as described in claim 5, further comprising:
   taking a remaining bit number after subtracting a sign field and an exponent field from a total bit number of the current encoded floating-point number to record the fraction value of the current encoded floating-point number.

7. The method for encoding as described in claim 6, further comprising:
   dropping or rounding off a remaining part of the fraction value when a bit number of the fraction value is greater than the remaining bit number.

8. The method for encoding as described in claim 1, wherein the at least one original floating-point number comprises a plurality of original floating-point numbers, and the method for encoding further comprises:
   counting the original exponent values of the original floating-point numbers so as to obtain a value range of the original exponent values; and
   determining the number of exponent bits of the at least one encoded floating-point number according to the value range.

9. The method for encoding as described in claim 8, further comprising:
   selecting one of the original exponent values as a first representative value;
   selecting a value corresponding to the first representative value from a value range of the number of exponent bits of the at least one encoded floating-point number as a second representative value; and
   taking the first representative value and the second representative value to calculate the exponent bias.

10. The method for encoding as described in claim 9, wherein the first representative value is a largest original exponent value in the original exponent values, and the second representative value is a largest value in the value range of the number of the exponent bits of the at least one encoded floating-point number.

11. An apparatus for encoding of floating-point number, comprising:
- an arithmetic circuit, generating at least one original floating-point number;
- a storage unit; and
- a conversion circuit, coupled to the arithmetic circuit so as to receive the at least one original floating-point number, wherein the conversion circuit determines a number of exponent bits of the at least one encoded floating-point number and calculates an exponent bias according to at least one original exponent value of the at least one original floating-point number, the conversion circuit converts an original exponent value of a current original floating-point number of the at least one original floating-point number to an encoded exponent value of a current encoded floating-point number of the at least one encoded floating-point number according to the exponent bias, and the conversion circuit stores the at least one encoded floating-point number in the storage unit.

12. The apparatus for encoding as described in claim 11, wherein the conversion circuit takes a sign value of the current original floating-point number as a sign value of the current encoded floating-point number.

13. The apparatus for encoding as described in claim 11, wherein the at least one original floating-point number comprises a plurality of original floating-point numbers, and the conversion circuit drops the sign value of each of the original floating-point numbers during converting the original floating-point numbers to the at least one encoded floating-point number, when a sign value of each of the original floating-point numbers is a common sign value.

14. The apparatus for encoding as described in claim 13, wherein the conversion circuit stores the common sign value in a sign value register.

15. The apparatus for encoding as described in claim 11, wherein the conversion circuit takes a fraction value of the current original floating-point number as a fraction value of the current encoded floating-point number.

16. The apparatus for encoding as described in claim 15, wherein the conversion circuit takes a remaining bit number after subtracting a sign field and an exponent field from a total bit number of the current encoded floating-point number to record the fraction value of the current encoded floating-point number.

17. The apparatus for encoding as described in claim 16, wherein the conversion circuit drops or rounds off a remaining part of the fraction value when a bit number of the fraction value is greater than the remaining bit number.

18. The apparatus for encoding as described in claim 11, wherein the at least one original floating-point number comprises a plurality of original floating-point numbers, the conversion circuit counts the original exponent values of the original floating-point numbers so as to obtain a value range of the original exponent values, and the conversion circuit determines the number of exponent bits of the at least one encoded floating-point number according to the value range.

19. The apparatus for encoding as described in claim 18, wherein the conversion circuit selects one of the original exponent values as a first representative value, the conversion circuit selects a value corresponding to the first representative value from a value range of the number of exponent bits of the at least one encoded floating-point number as a second representative value, and the conversion circuit takes the first representative value and the second representative value to calculate the exponent bias.

20. The apparatus for encoding as described in claim 19, wherein the first representative value is a largest original exponent value in the original exponent values, the second representative value is a largest value in the value range of the number of the exponent bits of the at least one encoded floating-point number.

21. A method for decoding of floating-point number, converting at least one encoded floating-point number to at least one decoded floating-point number, wherein the method for decoding comprises:
- receiving an exponent bias corresponding to the at least one encoded floating-point number;
- converting an encoded exponent value of a current encoded floating-point number of the at least one encoded floating-point number to a decoded exponent value of a current decoded floating-point number of the at least one decoded floating-point number according to the exponent bias and a standard bias.

22. The method for decoding as described in claim 21, further comprising:
- taking a sign value of the current encoded floating-point number as a sign value of the current decoded floating-point number.

23. The method for decoding as described in claim 21, further comprising:
- taking a fraction value of the current encoded floating-point number as a fraction value of the current decoded floating-point number.

24. The method for decoding as described in claim 23, further comprising:
- filling in 0 into a remaining part of the fraction field of the current decoded floating-point number when a bit number of the fraction field of the current decoded floating-point number is greater than a bit number of the fraction value of the current encoded floating-point number, after filling the fraction value of the current encoded floating-point number into the fraction field of the current decoded floating-point number.

25. The method for decoding as described in claim 21, further comprising:
- calculating a difference between the exponent bias and the standard bias;
- taking the difference to convert the encoded exponent of the current encoded floating-point number to the decoded exponent value of the current decoded floating-point number.

26. The method for decoding as described in claim 25, further comprising:
- subtracting the exponent bias from the standard bias to generate the difference; and
- adding the difference to the encoded exponent value of the current encoded floating-point number so as to generate the decoded exponent value of the current decoded floating-point number.

27. The method for decoding as described in claim 25, further comprising:
- subtracting the standard bias from the exponent bias so as to generate the difference; and
- subtracting the difference from the encoded exponent value of the current encoded floating-point number so as to generate the decoded exponent value of the current decoded floating-point number.

28. An apparatus for decoding of floating-point number, comprising:

a storage unit, configured to store at least one encoded floating-point number and an exponent bias corresponding to the at least one encoded floating-point number;

an arithmetic circuit; and a conversion circuit, coupled to the storage unit so as to receive the at least one encoded floating-point number and the exponent bias, wherein the conversion circuit converts an encoded exponent value of a current encoded floating-point number of the at least one encoded floating-point number to a decoded exponent value of a current decoded floating-point number of at least one decoded floating-point number according to the exponent bias and a standard bias, and the conversion circuit provides the at least one decoded floating-point number to the arithmetic circuit.

29. The apparatus for encoding as described in claim 28, wherein the conversion circuit takes a sign value of the current encoded floating-point number as a sign value of the current decoded floating-point number.

30. The apparatus for encoding as described in claim 28, wherein the conversion circuit takes a fraction value of the current encoded floating-point number as a fraction value of the current decoded floating-point number.

31. The apparatus for encoding as described in claim 30, wherein, when a bit number of the fraction field of the current decoded floating-point number is greater than a bit number of the fraction value of the current encoded floating-point number, the conversion circuit fills the fraction value of the current encoded floating-point number into the fraction field of the current decoded floating-point number, and the conversion circuit fills in 0 into a remaining part of the fraction field of the current decoded floating-point number.

32. The apparatus for encoding as described in claim 28, wherein the conversion circuit calculates a difference between the exponent bias and the standard bias, and the conversion circuit takes the difference to convert the encoded exponent value of the current encoded floating-point number to the decoded exponent value of the current decoded floating-point number.

33. The apparatus for encoding as described in claim 32, wherein the conversion circuit subtracts the exponent bias from the standard bias so as to generate the difference, and the conversion circuit adds the difference to the encoded exponent value of the current encoded floating-point number so as to generate the decoded exponent value of the current decoded floating-point number.

34. The apparatus for encoding as described in claim 32, wherein the conversion circuit subtracts the standard bias from the exponent bias so as to generate the difference, and the conversion circuit subtracts the difference from the encoded exponent value of the current encoded floating-point number so as to generate the decoded exponent value of the current decoded floating-point number.

* * * * *